US011042238B1

(12) United States Patent
Zhang et al.

(10) Patent No.: US 11,042,238 B1
(45) Date of Patent: Jun. 22, 2021

(54) DISPLAY PANEL AND DISPLAY DEVICE

(71) Applicant: Xiamen Tianma Micro-Electronics Co., Ltd, Xiamen (CN)

(72) Inventors: Tingting Zhang, Xiamen (CN); Changzhi Wu, Xiamen (CN); Ying Sun, Xiamen (CN); Yumin Xu, Xiamen (CN)

(73) Assignee: Xiamen Tianma Micro-Electronics Co., Ltd, Xiamen (CN)

( * ) Notice: Subject to any disclaimer, the term of this patent is extended or adjusted under 35 U.S.C. 154(b) by 0 days.

(21) Appl. No.: 16/823,858

(22) Filed: Mar. 19, 2020

(30) Foreign Application Priority Data

Dec. 20, 2019 (CN) .......................... 201911322928.0

(51) Int. Cl.
*G06F 3/041* (2006.01)
*H05K 1/18* (2006.01)
*G06K 9/00* (2006.01)

(52) U.S. Cl.
CPC ....... *G06F 3/0412* (2013.01); *G06K 9/00013* (2013.01); *H05K 1/189* (2013.01); *H05K 2201/10128* (2013.01)

(58) Field of Classification Search
CPC .................. G06F 3/0412; H05K 1/189; H05K 2201/10128; G06K 9/00013
See application file for complete search history.

(56) References Cited

U.S. PATENT DOCUMENTS

| 9,575,583 | B2 * | 2/2017 | Woo | G06F 3/0412 |
|---|---|---|---|---|
| 9,830,025 | B2 * | 11/2017 | Han | G06F 3/0412 |
| 10,268,861 | B2 * | 4/2019 | Li | G06F 3/041 |
| 10,712,856 | B2 * | 7/2020 | Aoki | G06F 3/0446 |
| 10,936,139 | B2 * | 3/2021 | Wang | G06F 3/0412 |
| 2008/0174535 | A1 * | 7/2008 | Yoon | H01L 24/81 345/90 |
| 2014/0218327 | A1 * | 8/2014 | Shi | G06F 3/041 345/174 |
| 2017/0060321 | A1 * | 3/2017 | Jeong | G06F 3/04166 |
| 2017/0124372 | A1 * | 5/2017 | Evans, V | G06K 9/0002 |
| 2017/0147850 | A1 * | 5/2017 | Liu | G06F 3/0412 |
| 2017/0336907 | A1 * | 11/2017 | Jeong | G06F 3/0412 |

(Continued)

FOREIGN PATENT DOCUMENTS

| CN | 105094490 A | 11/2015 |
| CN | 107479276 A | 12/2017 |

*Primary Examiner* — Grant Sitta
(74) *Attorney, Agent, or Firm* — Christensen O'Connor Johnson Kindness PLLC

(57) ABSTRACT

A display panel, having a display area where display units, touch electrodes, and fingerprint identification units are arranged, and a non-display area including first to third bonding areas, the second and third bonding areas being located on two sides of the first bonding area, respectively. First pads, second pads, and third pads are arranged in the bonding areas, and the number of the first pads is greater than the number of the third pads, and the number of the second pads is greater than the number of the third pads. One or more first pads, one or more second pads, and one or more third pads are arranged in the first bonding area alternately. Each of the second bonding area and the third bonding area is provided with one or more first pads and one or more second pads. A display device includes the display panel.

19 Claims, 11 Drawing Sheets

(56) References Cited

U.S. PATENT DOCUMENTS

| | | | |
|---|---|---|---|
| 2017/0344166 A1* | 11/2017 | Nam | G02F 1/133536 |
| 2018/0129319 A1* | 5/2018 | Hekmatshoartabari | G06K 9/0002 |
| 2018/0196544 A1* | 7/2018 | Wang | G06F 3/0442 |
| 2018/0260608 A1* | 9/2018 | Liao | G09G 3/3648 |
| 2018/0329544 A1* | 11/2018 | Yeh | G06F 3/0418 |
| 2019/0064979 A1* | 2/2019 | Liu | G06F 3/047 |
| 2019/0121463 A1* | 4/2019 | Park | G06F 3/041662 |
| 2019/0220113 A1* | 7/2019 | Zheng | G06K 9/0004 |

* cited by examiner

DISPLAY PANEL AND DISPLAY DEVICE

CROSS-REFERENCE TO RELATED APPLICATIONS

The present application claims priority to Chinese Patent Application No. 201911322928.0, filed on Dec. 20, 2019, the content of which is incorporated herein by reference in its entirety.

TECHNICAL FIELD

The present disclosure relates to the field of display technology and, in particular, to a display panel and a display device including the display panel.

BACKGROUND

With the development of display technology, displays with high screen ratios and narrow borders are becoming more and more popular due to their good user experience. The screen ratio refers to a ratio of a screen area to an entire machine area, and a high screen ratio provides better visual effects and user experience.

A fingerprint is an innate and unique biological characteristic, which makes fingerprint identification more secure. Moreover, since the fingerprint identification is simple, it is widely used in various fields, and electronic devices having a fingerprint identification function are becoming more and more. Taking a mobile phone as an example, the fingerprint identification can be applied to various scenarios such as unlocking and payment. In order to increase the screen ratio while having the fingerprint identification function, the fingerprint identification scheme embedded in the display panel is receiving more and more attention. In existing display panels, the fingerprint identification function, a display function, and a touch function are provided in different integrated circuits, which will inevitably occupy a lot of space on the border of the display panel, and thus does not conform to a development trend of narrow borders and high screen ratios.

SUMMARY

In order to solve the above technical problems, the present disclosure provides a display panel and a display device including the display panel.

In a first aspect, the present disclosure provides a display panel. The display panel has a display area and a non-display area, the non-display area comprises a bonding area to which a flexible printed circuit or an integrated circuit is bound, the bonding area comprises a first bonding area, a second bonding area, and a third bonding area, and the second bonding area and the third bonding area are located on two sides of the first bonding area in a first direction, respectively. The display panel comprises: a plurality of display units arranged in the display area; a plurality of touch electrodes arranged in the display area; a plurality of fingerprint identification units arranged in the display area; a plurality of first pads arranged in the bonding area; a plurality of second pads arranged in the bonding area; and a plurality of third pads arranged in the bonding area. The number of the plurality of first pads is greater than a number of the plurality of third pads, and a number of the plurality of second pads is greater than the number of the plurality of third pads. One or more first pads of the plurality of first pads, one or more second pads of the plurality of second pads, and one or more third pads of the plurality of third pads are alternately arranged in the first bonding area; one or more first pads of the plurality of first pads and one or more second pads of the plurality of second pads are arranged in the second bonding area; and one or more first pads of the plurality of first pads and one or more second pads of the plurality of second pads are arranged in the third bonding area. Each of the plurality of first pads, the plurality of second pads, and the plurality of third pads is one of display pads, one of touch pads, or one of fingerprint identification pads; and each of the plurality of first pads, each of the plurality of second pads, and each of the plurality of third pads are different from each other. The display pads are configured to provide display signals to the plurality of display units, the touch pads are configured to provide touch driving signals to the plurality of touch electrodes and/or receive touch sensing signals of the plurality of touch electrodes, and the fingerprint identification pads are configured to receive fingerprint identification signals of the plurality of fingerprint identification units.

In a second aspect, the present disclosure provides a display device including the display panel provided in the first aspect.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure.

DESCRIPTION OF EMBODIMENTS

Figure 1:
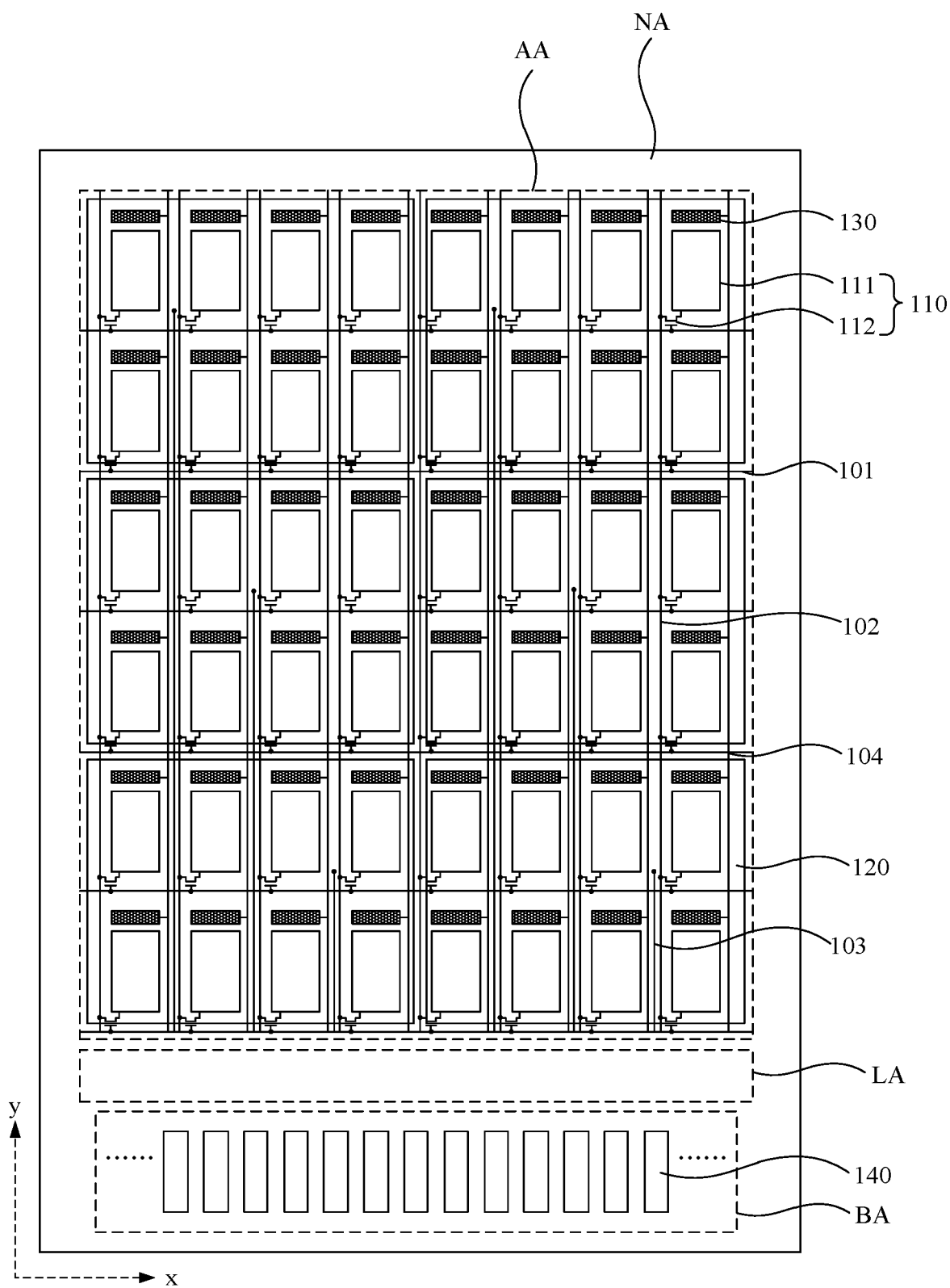
FIG. 1 is a schematic plan diagram of a display panel according to an embodiment of the present disclosure.

In order to better understand technical solutions of the present disclosure, the embodiments of the present disclosure are described in detail with reference to the drawings.

It should be clear that the described embodiments are merely part of the embodiments of the present disclosure rather than all of the embodiments.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

It should be understood that the term "and/or" as used herein is merely an association relationship describing the associated object, indicating that there may be three relationships. For example, A and/or B may indicate three cases: only A exists; A and B exist concurrently; only B exists. In addition, a character "/" herein generally indicates that the contextual objects are in an "or" relationship.

It should be understood that although the terms first, second, etc. may be used to describe the device in the embodiments of the present disclosure, these devices should not be limited to these terms. These terms are only used to distinguish devices from one another. For example, a first device could also be termed a second device, and similarly, a second device could also be termed a first device without departing from the scope of the embodiments of the present disclosure.

In view of the problems existing in the display panel mentioned in the Background, the present disclosure provides a display panel has a display area and a non-display area. A plurality of display units, a plurality of touch electrodes, and a plurality of fingerprint identification units are arranged in the display area. The non-display area includes a bonding area, and the bonding area is an area to which a flexible printed circuit or an integrated circuit is bound. The bonding area includes a first bonding area, a second bonding area and a third bonding area, and the second bonding area and the third bonding area are located on two sides of the first bonding area in a first direction, respectively. A plurality of first pads, a plurality of second pads, and a plurality of third pads are arranged in the bonding area. The number of the first pads is greater than the number of the third pads, and the number of the second pads is greater than the number of the third pads. At least one of the first pads, at least one of the second pads and at least one of the third pads are arranged in the first bonding area, and the at least one first pad, the at least one second pad, and the at least one third pad in the first bonding area are arranged alternately. At least one of the first pads and at least one of the second pads are arranged in the second bonding area. At least one of the first pads and at least one of the second pads are arranged in the third bonding area. Each of the first pad, the second pad, and the third pad is one of a display pad, a touch pad, and a fingerprint identification pad, and the first pad, the second pad, and the third pad are different from each other. The display pad is configured to provide a display signal to the display unit, the touch pad is configured to provide a touch driving signal to the touch electrode and/or receive a touch sensing signal of the touch electrode, and the fingerprint identification pad is configured to receive a fingerprint identification signal of the fingerprint identification unit.

Figure 2:
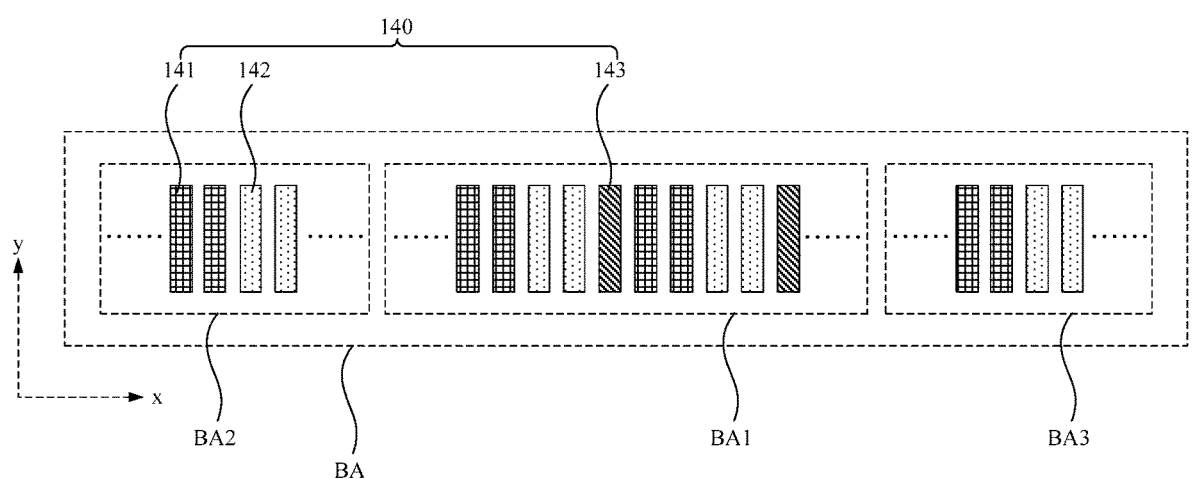
FIG. 2 is a schematic diagram of a pad distribution in a bonding area in FIG. 1.

Referring to FIG. 1 and FIG. 2, FIG. 1 is a schematic plan diagram of a display panel according to an embodiment of the present disclosure, and FIG. 2 is a schematic diagram of a pad distribution of a bonding area in FIG. 1. The display panel has a display area AA and a non-display area NA surrounding the display area AA. A plurality of display units 110, a plurality of touch electrodes 120, and a plurality of fingerprint identification units 130 are arranged in the display area AA. The non-display area NA includes a bonding area BA, and the bonding area BA is where a flexible printed circuit or an integrated circuit is bound. The bonding area BA includes a first bonding area BA1, a second bonding area BA2, and a third bonding area BA3, and in a first direction x, the second bonding area BA2 and the third bonding area BA3 are located on two sides of the first bonding area BA1, respectively.

The bonding area BA is provided with a plurality of pads 140, and the plurality of pads 140 includes a plurality of first pads 141, a plurality of second pads 142, and a plurality of third pads 143. The number of the first pads 141 is greater than the number of the third pads 143, and the number of the second pads 142 is greater than the number of the third pads 143. The first bonding area BA1 is provided with at least one of the first pads 141, at least one of the second pads 142, and at least one of the third pads 143, and the at least one first pad 141, the at least one second pad 142, and the at least one third pad 143 in the first bonding area BA1 are arranged alternately. The second bonding area BA2 is provided with at least one of the first pads 141 and at least one of the second pads 142. The third bonding area BA3 is provided with at least one of the first pads 141 and at least one of the second pads 142. Each of the first pad 141, the second pad 142, and the third pad 143 is one of a display pad, a touch pad, and a fingerprint identification pad, and the first pad 141, the second pad 142, and the third pad 143 are different from each other. The display pad is configured to provide a display signal to the display unit 110, the touch pad is configured to provide a touch driving signal to the touch electrode 120 and/or receive a touch sensing signal of the touch electrode 120, and the fingerprint identification pad is configured to receive a fingerprint identification signal of the fingerprint identification unit 130.

It should be noted that the at least one first pad 141, the at least one second pad 142, and the at least one third pad 143 in the first bonding area BA being arranged alternately means that the at least one first pad 141, the at least one second pad 142, and the at least one third pad 143 in the first bonding area BA are arranged in an alternating pattern or sequence, for example, but not limited to, one first pad 141, then one second pad 142, and then one third pad 143 or a pair of first pads 141, then a pair of second pads 142, and then a pair of third pads 143, or a group containing any first number of first pads, then a group containing any second number of second pads 142, and then a group containing any third number of third pads 143, as long as at least some (but not necessarily all) of the pads of the same type are spaced apart (i.e., there may be more than one consecutive type of pad of the same type, as shown in FIG. 2). In some embodiments, at least two of: the first number, the second number, and the third number are different. In some embodiments, the first number, the second number, and the third number are the same. In FIG. 2, the manner in which the first pads 141, the second pads 142, and the third pads 143 in the first bonding area BA are arranged alternately is merely illustrative, while in other optional embodiments of the present disclosure, these pads may be arranged alternately in other manners.

Compared with the related art, the display panel and the display device provided by the embodiments of the present disclosure is provided with three different types of pads 140 in the bonding area BA, which are a display pad, a touch pad, and a fingerprint identification pad, respectively. Among them, the display pad is configured to provide a display signal to the display unit 110, the touch pad is configured to provide a touch driving signal to the touch electrode 120 and/or receive a touch sensing signal of the touch electrode 120, and the fingerprint identification pad is configured to receive a fingerprint identification signal of the fingerprint identification unit 130. In addition, these three types of pads 140 are arranged in partitioned areas, and at least the three types of pads 140 of the first bonding area BA are arranged alternately, so that wirings located between the bonding area BA and the display area AA and used for connecting the pads 140 can be shortened, and thus it avoids the situation that the wirings are laid obliquely too long, which effectively reduces resistance of the wirings and also reduces a width (i.e., a width in a second direction y perpendicular to the first direction x) of a wiring area LA (an area where the wirings between the bonding area BA and the display area AA are located) between the bonding area BA and the display area AA. In this way, the fingerprint identification function, the display function, and the touch function are integrated in the same integrated circuit while requirements of a narrow border and a high screen ratio of the display panel are met.

Figure 3:
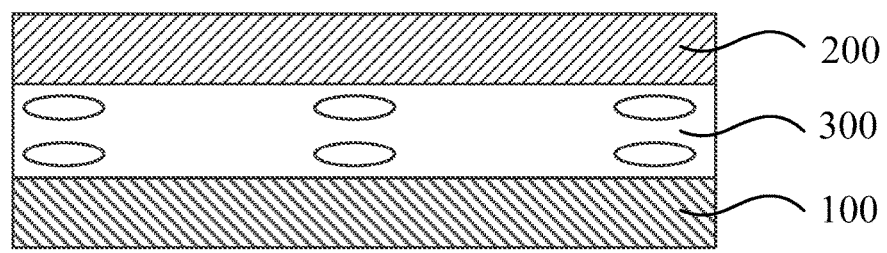
FIG. 3 is a cross-sectional schematic diagram of a display panel according to an embodiment of the present disclosure.

FIG. 3 is a schematic cross-sectional diagram of a display panel according to an embodiment of the present disclosure. Referring to FIG. 1 and FIG. 3 in conjunction, in this embodiment of the present disclosure, the display panel includes an array substrate 100 and an opposite substrate 200 which are opposite to each other, and a liquid crystal layer 300 located between the array substrate 100 and the opposite substrate 200. The array substrate 100 includes a plurality of scanning lines 101 and a plurality of data lines 102. The plurality of scanning lines 101 extends in the first direction x and is arranged in the second direction y, the plurality of data lines 102 extends along the second direction y and is arranged along the first direction x, and the first direction x is perpendicular to the second direction y. The plurality of scanning lines 101 is insulated from and intersected with the plurality of data lines 102 to define a plurality of sub-pixel areas arranged in an array. A display unit 110 is provided in each of the sub-pixel areas. The display unit 110 includes a pixel electrode 111 and a thin film transistor 112. A gate electrode of the thin film transistor 112 is electrically connected to one scanning line 101, a source electrode of the thin film transistor 112 is electrically connected to one data line 102, and a drain electrode of the thin film transistor 112 is electrically connected to the pixel electrode 111. The array substrate may further include a common electrode. When the display panel displays, under control of the corresponding scanning line 101, the data line 102 corresponding to the source electrode of the thin film transistor 112 performs, through the thin film transistor 112, charging and discharging on the pixel electrode 111 corresponding to the drain electrode, and a parallel electric field is formed between the pixel electrode 111 and the common electrode to drive the liquid crystals to rotate to achieve the display function. Each of the data lines 102 is electrically connected to one display pad through the wiring (not shown in the drawing) between the bonding area BA and the display area AA. It should be noted that the number of the display units 110 in the display area AA in FIG. 1 is only illustrative, and actually, the number of the display units 110 may be more, which will not be further described here.

In an alternative embodiment, the common electrode for implementing the display function described above may be reused as the touch electrode 120 during a touch stage. A plurality of touch electrodes 120 insulated from each other is arranged in an m×n array, where m and n are both integers greater than 1 (for example in the drawing, m=3 and n=2). A row direction of the array of the touch electrodes 120 is the first direction x, and a column direction thereof is the second direction y. The plurality of touch electrodes 120 perform touch detection through self-capacitance during the touch stage. The array substrate 100 further includes a plurality of touch signal lines 103, and each touch electrode 120 is electrically connected to one touch pad through the wiring between the bonding area BA and the display area AA and one touch signal line 103. Generally, an area of the touch electrode 120 is greater than an area of the display unit 110, and in a direction perpendicular to the plane of the display panel, each touch electrode 120 overlaps a plurality of display units 110. It should be noted that the number of the touch electrodes 120 in the display area AA in FIG. 1 is only illustrative, and actually, the number of the touch electrodes 120 may be more, which will not be further described here.

Figure 4:
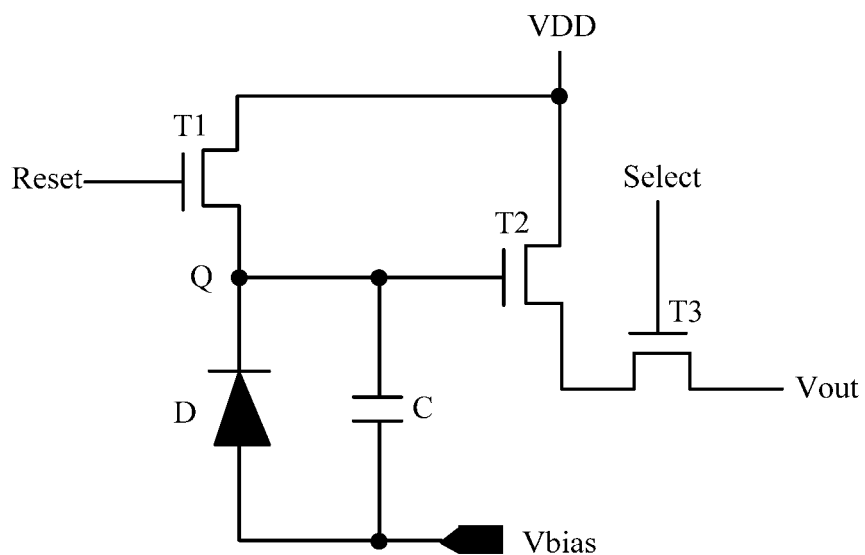
FIG. 4 is a schematic diagram of a circuit of a fingerprint identification unit according to an embodiment of the present disclosure.

In an alternative embodiment, the array substrate 100 further includes a plurality of fingerprint identification signal lines 104, each fingerprint identification unit 130 is connected to one fingerprint identification signal line 104, and each fingerprint identification unit 130 is electrically connected to one fingerprint identification pad through the wiring between the bonding area BA and the display area AA and one fingerprint identification signal line 104. It should be noted that the number of the fingerprint identification units 130 in the display area AA in FIG. 1 is only illustrative, and actually, the number of the fingerprint identification units 130 may be more, and details are not described herein again. FIG. 4 is a schematic circuit diagram of a fingerprint identification unit according to an embodiment of the present disclosure. Referring to FIG. 4, the fingerprint identification unit includes a first thin film transistor T1, a second thin film transistor T2, a third thin film transistor T3, a capacitor C, and a photodiode D. A control terminal of the first thin film transistor T1 is electrically connected to a reset control scanning line Reset, a first terminal of the first thin film transistor T1 is electrically connected to a driving voltage signal terminal VDD, a second terminal of the first thin film transistor T1 is electrically connected to a negative electrode of the photodiode D, an positive electrode of the photodiode D is electrically connected to a reference voltage signal terminal Vbias, and the capacitor C and the photodiode D are connected in parallel. A control terminal of the second thin film transistor T2 is electrically connected to the second terminal of the first thin film transistor T1, a first terminal of the second thin film transistor T2 is electrically connected to the driving voltage signal terminal VDD, a second terminal of the second thin film transistor T2 is electrically connected to a first terminal of the third thin film transistor T3, a control terminal of the third thin film transistor T3 is electrically connected to an output control scanning line Select, and a second terminal of the third thin film transistor T3 is electrically connected to an output terminal Vout. The output terminal Vout of each fingerprint identification unit is connected to one fingerprint identification signal line 104. Correspondingly, a fingerprint identification process corresponding to this fingerprint identification unit includes a reset stage, a first reading stage, and a second reading stage in sequence, and an integration stage is interposed between the first reading stage and the second reading stage.

Figure 5:
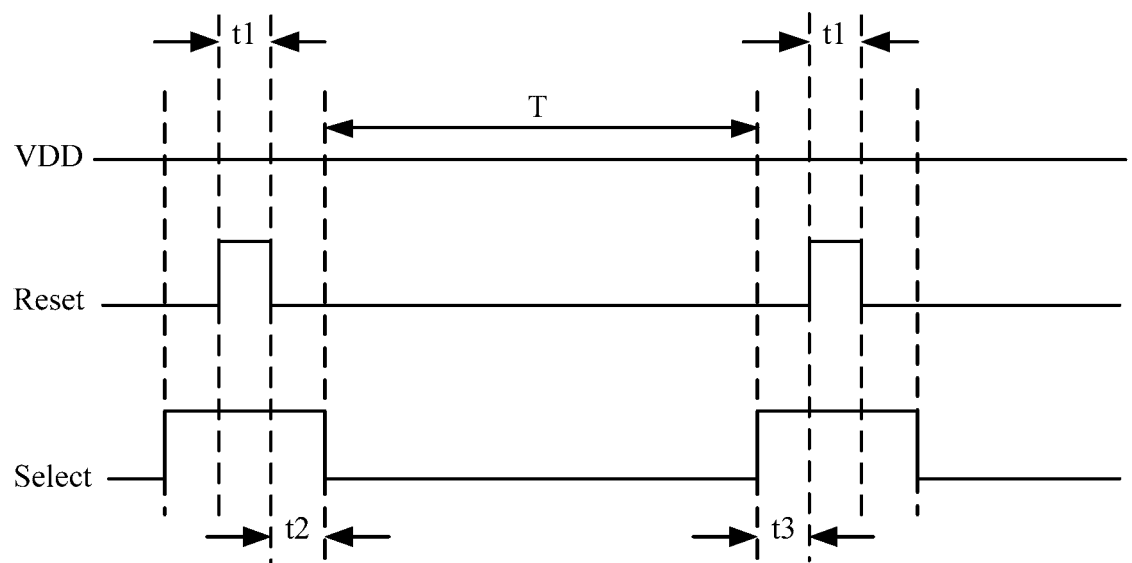
FIG. 5 is a schematic diagram of a working timing sequence of the fingerprint identification unit in FIG. 4.

Exemplarily, FIG. 5 is a schematic diagram of a working timing sequence of the fingerprint identification unit in FIG. 4. Referring to FIG. 4 and FIG. 5, a working process of the fingerprint identification unit is: in the reset stage t1, a high level provided by the reset control scanning line Reset turns on the first thin film transistor T1, and a voltage on the driving voltage signal terminal VDD is transmitted to a node Q through the first thin film transistor T1 so as to reset a potential of the node Q; and in the first reading stage t2, the integration stage T and the second reading stage t3, the first thin film transistor T1 is turned off, the photodiode D generates a leakage current due to being irradiated by light, the capacitor C discharges, the potential of the node Q gradually decreases, the second thin film transistor T2 operates in a linear area, and a magnitude of its leakage current is proportional to the potential of the node Q. In the first reading stage t2, the third thin film transistor T3 is controlled to be conducted, the voltage provided by the driving voltage signal terminal VDD flows to the output terminal Vout through the second thin film transistor T2 and the third thin film transistor T3. An on resistance ($R_{on}$) of the second thin film transistor T2 determines the potential on the output terminal Vout, and the on resistance ($R_{on}$) of the second thin film transistor T2 is determined by the voltage of the node Q, that is, the potential of the node Q determines the potential on the output terminal Vout. A voltage value at the output terminal Vout read in the first reading stage t2 is V1, and the voltage value at the output terminal Vout read in the second reading stage t3 is V2, then V1-V2 is determined by a magnitude of the leakage current of the photodiode D, and the magnitude of the leakage current of the photodiode D is determined by an intensity of light it receives, so that V2 is different under different light intensities. During fingerprint detection, light reflected to photodiodes D at different fingerprint areas have different intensities. Therefore, by detecting VI-V2 corresponding to light sensing units at respective positions in the fingerprint identification area, fingerprint identification can be achieved.

In addition, an area for implementing the fingerprint identification is the fingerprint identification area, and the fingerprint identification unit 130 in the above embodiment is located in the fingerprint identification area. The fingerprint identification area may partially overlap the display area AA, and the fingerprint identification function of part of the display area AA of the display panel can be simply realized through the fingerprint identification area. The fingerprint identification area may completely overlap the display area AA, that is, the fingerprint identification units 130 are arranged on the whole display area AA, and finger touch at any position on the display panel can trigger the fingerprint identification unit to perform the fingerprint identification, so that a full-screen fingerprint identification function can be realized, thereby providing more convenient and faster fingerprint identification with higher accuracy. When the fingerprint identification area completely overlaps the display area, each display unit may correspond to one fingerprint identification unit, or a plurality of display units correspond to one fingerprint identification unit. FIG. 1 exemplarily shows that the fingerprint identification area completely overlaps the display area AA, and each display unit 110 corresponds one fingerprint identification unit 130.

Generally, in the display panel, the number of the display units is greater than or equal to the number of the fingerprint identification units, and the number of the fingerprint identification units is greater than the number of the touch electrodes. In an alternative embodiment of the present disclosure, the first pad 141 is a display pad, the second pad 142 is a fingerprint identification pad, and the third pad 143 is a touch pad. However, the present disclosure is not limited thereto, and other embodiments are also feasible as long as each of the first pad, the second pad, and the third pad is the display pad, the touch pad, or the fingerprint identification pad, and the first pad, the second pad, and the third pad are different from each other.

With continued reference to FIG. 2, in an embodiment, the first pads 141 and the second pads 142 in the second bonding area BA2 are arranged alternately, and the first pads 141 and the second pads 142 in the third bonding area BA3 are arranged alternately. Therefore, all the three types of pads located in the first bonding area BA1, the second bonding area BA2, and the third bonding area BA3 are arranged alternately, so that the wirings located between the bonding area BA and the display area AA and used for connecting the pads 140 can be shortened, and it avoids the situation that the wirings are laid obliquely too long, which effectively reduces resistance of the wirings and also reduces the width of the wiring area LA between the bonding area BA and the display area AA, thereby further reducing the border of the display panel and increasing the screen ratio.

Figure 6:
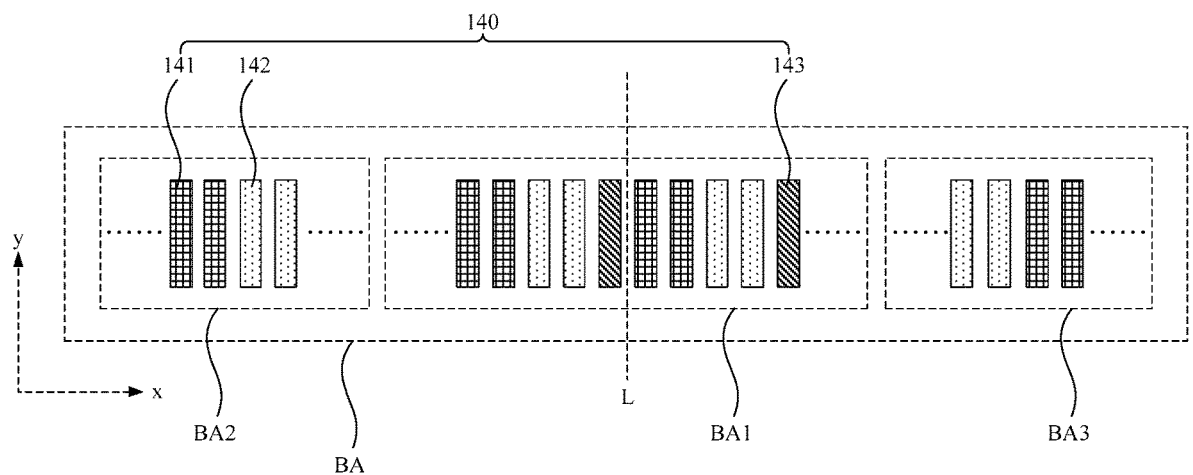
FIG. 6 is a schematic diagram of another pad distribution of the bonding area in FIG. 1.

FIG. 6 is a schematic diagram of another pad distribution in the bonding area in FIG. 1. Referring to FIG. 6, in this embodiment, the same features as those of the bonding areas shown in FIG. 2 are not repeated, and a difference lies in that the second bonding area BA2 and the third bonding area BA3 are axis-symmetrical with each other about a centerline L of the first bonding area BA1, where an extending direction of the centerline L of the first bonding area BA1 is perpendicular to the first direction x, that is, the centerline L extends along the second direction y in the drawing. It should be noted that, in this embodiment, the second bonding area BA2 and the third bonding area BA3 being axis-symmetrical with each other about the centerline L of the first bonding area BA1 means that an arrangement order of different pads in the second bonding area BA2 and an arrangement order of different pads in the third bonding area BA3 are axis-symmetrical with each other about the centerline L of the first bonding area BA1. Taking FIG. 6 as an example, along the first direction x, if different pads in the second bonding area BA2 are arranged in an order of, from left to right in the figure, one first pad 141, one first pad 141, one second pad 142, and one second pad 142, then different pads in the third bonding area BA3 are arranged in an order of, from left to right in the figure, one second pad 142, one second pad 142, one first pad 141, and one first pad 141. By setting that the second bonding area BA2 and the third bonding area BA3 are axis-symmetrical with each other about the centerline L of the first bonding area BA1, it allows the wirings located between the second bonding area BA2 and the display area AA and used for connecting the pads to be better symmetrical with the wirings located between the third bonding area BA3 and the display area AA and used for connecting the pads, which is more conducive to the layout of the wirings, thereby further reducing the border of the display panel and increasing the screen ratio.

Figure 7:
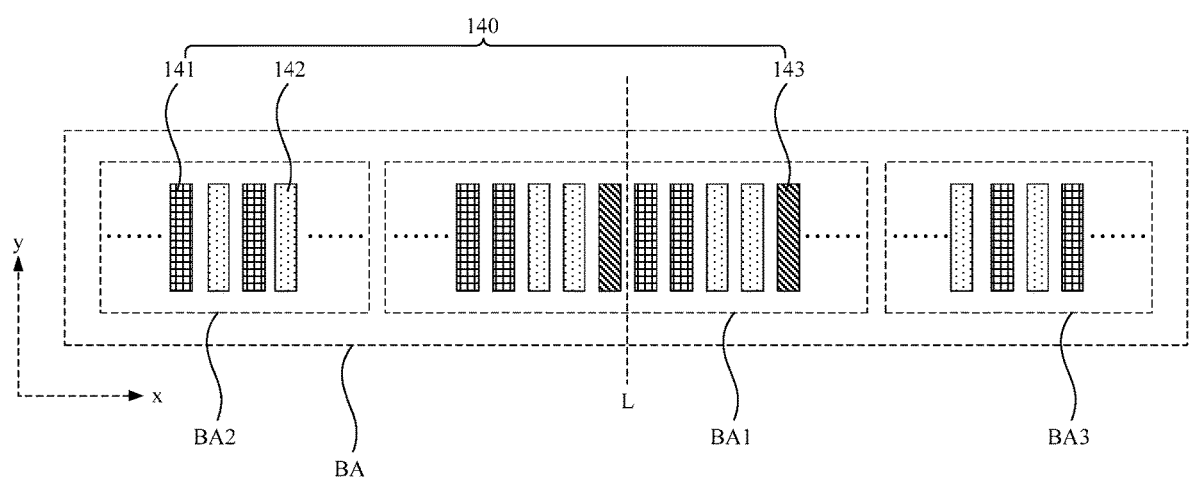
FIG. 7 is a schematic diagram of still another pad distribution of the bonding area in FIG. 1.

It should be noted that in the bonding areas shown in FIG. 2 and FIG. 6, first pads 141 and second pads 142 in each of the second bonding area BA2 and the third bonding area BA3 are arranged in an alternate pattern or sequence of a pair of first pads 141 and then a pair of second pads 142, and the first pads 141 and the second pads 142 can be arranged in an alternate pattern or sequence of a group containing any number of first pads 141 and then a group containing any number of second pads in other alternative embodiments of the present disclosure, as long as at least some of the pads of the same type are spaced apart from one another. As shown in FIG. 7, it is a schematic diagram of another pad distribution in the bonding area in FIG. 1. In this embodiment, one first pad 141 and one second pad 142 are arranged alternately in the second bonding area BA2 and the third bonding area BA3, which can also function to shorten the lengths of the wirings located between the bonding area BA and the display area AA and used for connecting the pads 140.

In addition, in the bonding areas shown in FIG. 2, FIG. 6, and FIG. 7, the number of the first pads 141 in the first bonding area BA1 is equal to the number of the second pads 142 in the first bonding area BA1 and is greater than the number of the third pads 143 in the first bonding area BA1, while only the first pads 141 and the second pads 142 are provided in the second bonding area BA2 and the third bonding area BA3, and no third pad 143 is provided in the second bonding area BA2 and the third bonding area BA3, in such a manner that the number of the first pads 141 is greater than the number of the third pads 143 and the number of the second pads 142 is greater than the number of the third pads 143. When the first pads 141 are display pad, the second pads 142 are fingerprint identification pads, and the third pads 143 are touch pads, in this embodiment, the number of the first pads 141 is equal to the number of the second pads 142 and is greater than the number of the third pads 143. That is, the number of the display pads is equal to the number of the fingerprint identification pads but is greater than the number of the touch pads. In conjunction with FIG. 1, this embodiment is applicable to a display panel in which the fingerprint identification area completely overlaps the display area AA and each display unit 110 corresponds to one fingerprint identification unit 130.

Figure 8:
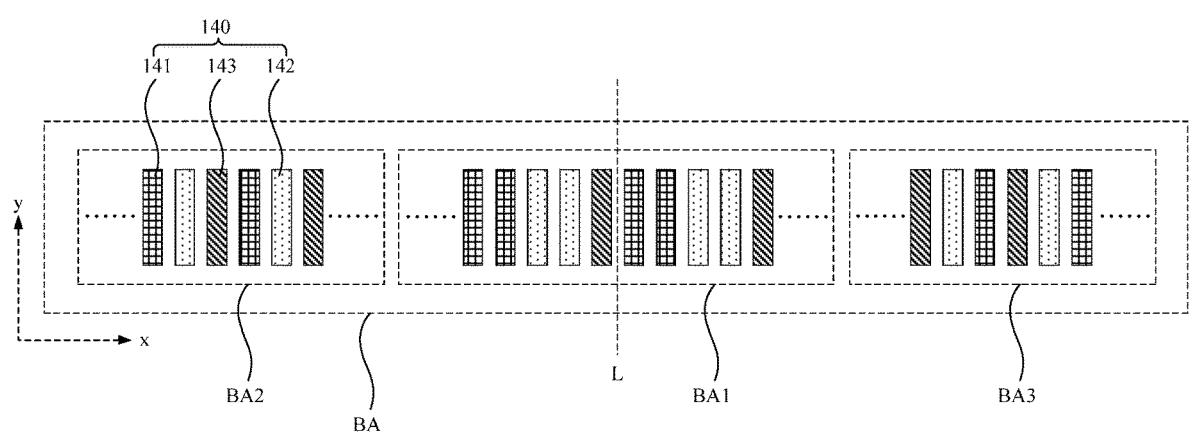
FIG. 8 is a schematic diagram of yet another pad distribution of the bonding area in FIG. 1.

In other alternative embodiments of the present disclosure, when the number of the first pads in the first bonding area is equal to the number of the second pads in the first bonding area and is greater than the number of the third pads in the first bonding area, the second bonding area and the third bonding area may also be provided with the third pad. FIG. 8 is a schematic diagram of another pad distribution in the bonding area in FIG. 1. Referring to FIG. 8, in this embodiment, the second bonding area BA2 is further provided with at least one third pad 143 in addition to the first pads 141 and the second pads 142, and the third bonding area BA3 is further provided with at least one third pad 143 in addition to the first pads 141 and the second pads 142; the first pads 141, the second pads 142, and the at least one third pad 143 of the second bonding area BA2 are arranged alternately, and the first pads 141, the second pads 142, and the at least one third pad 143 of the third bonding area BA3 are arranged alternately. When the display panel requires relatively more third pads 143, each of the second bonding area BA2 and the third bonding area BA3 may be further provided with the third pad 143, so that each of the first bonding area BA1, the second bonding area BA2, and the third bonding area BA3 is provided with the third pad 143, thereby preventing the wirings from being laid obliquely too long due to concentration of the third pads 143 in the first bonding area BA1. Moreover, in this embodiment, the first pad 141, the second pad 142, and the third pad 143 in the second bonding area BA2 are arranged alternately, and the first pad 141, the second pad 142, and the third pad 143 in the third bonding area BA3 are arranged alternately, which further shortens the wirings that are located between the bonding area BA and the display area AA and used for connecting the pads 140, effectively reduces the resistance of the wirings, and reduces the width of the wiring area LA between the bonding area BA and the display area AA.

With continued reference to FIG. 8, in this embodiment, in the second bonding area BA2, the number of the first pads 141, the number of the second pads 142, and the number of the third pads 143 are identical; and in the third bonding area BA3, the number of the first pads 141, the number of the second pads 142, and the number of the third pads 143 are identical. The first pads 141, the second pads 142, and the third pads 143 in each of the second bonding area BA2 and the third bonding area BA3 are arranged in a manner that one first pad 141, one second pad 142, and one third pad 143 are arranged alternately, i.e., in an alternating pattern or sequence in each of the second bonding area BA2 and the third bonding area BA3, including, but not limited to, one first pad 141, then one second pad 142, and then one third pad 143, or one second pad 142, then one first pad 141, and then one third pad 143. Or, in other words, one first pad 141, one second pad 142, and one third pad 143 being arranged in an alternating pattern or sequence in each of the second bonding area BA2 and the third bonding area BA3 may be interpreted that a group containing one first pad 141, one second pad 142, and one third pad 143 is arranged repeatedly in each of the second bonding area BA2 and the third bonding area BA3. The first pad 141, the second pad 142, and the third pad 143 in the group can be arranged in any order, and an order of pads in the group in the second bonding area BA2 may be the same as or different from an order of pads in the group in the third bonding area BA3. In this way, the lengths of the wirings that are located between the bonding area BA and the display area AA and used for connecting the pads 140 are shortened. This embodiment also satisfies that the number of the first pads 141 is greater than the number of the third pads 143 and the number of the second pads 142 is greater than the number of the third pads 143. When the first pads 141 are display pads, the second pads 142 are fingerprint identification pads, and the third pads 143 are touch pads, then in this embodiment, the number of the first pads 141 is equal to the number of the second pads 142 and is greater than the number of the third pads 143, that is, the number of the display pads is equal to the number of the fingerprint identification pads and is greater than the number of the touch pads. Referring to FIG. 1, this embodiment is also applicable to the display panel in which the fingerprint identification area completely overlaps the display area AA and each display unit 110 corresponds to one fingerprint identification unit 130.

Figure 9:
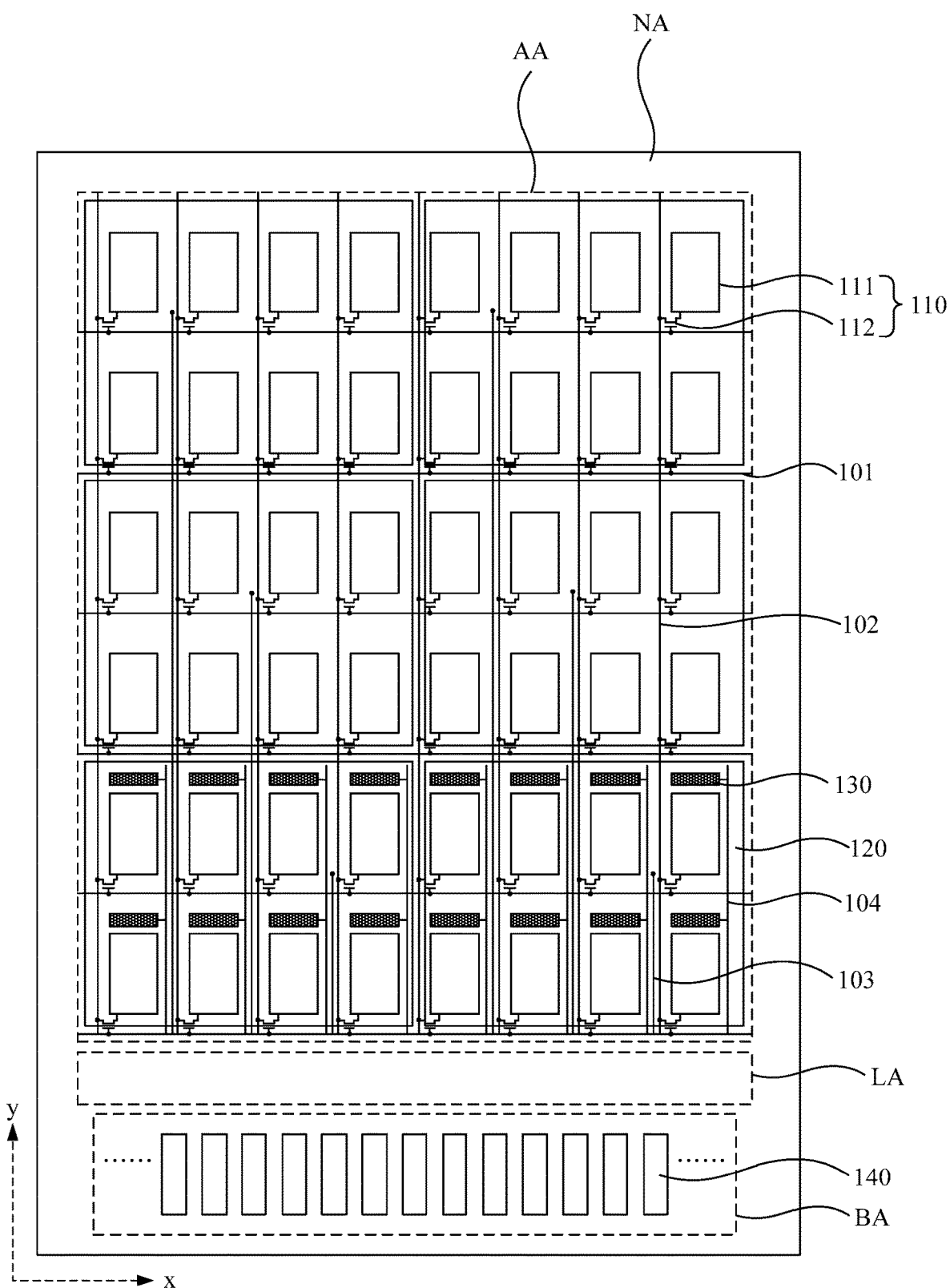
FIG. 9 is a schematic plan diagram of another display panel according to an embodiment of the present disclosure.
Figure 10:
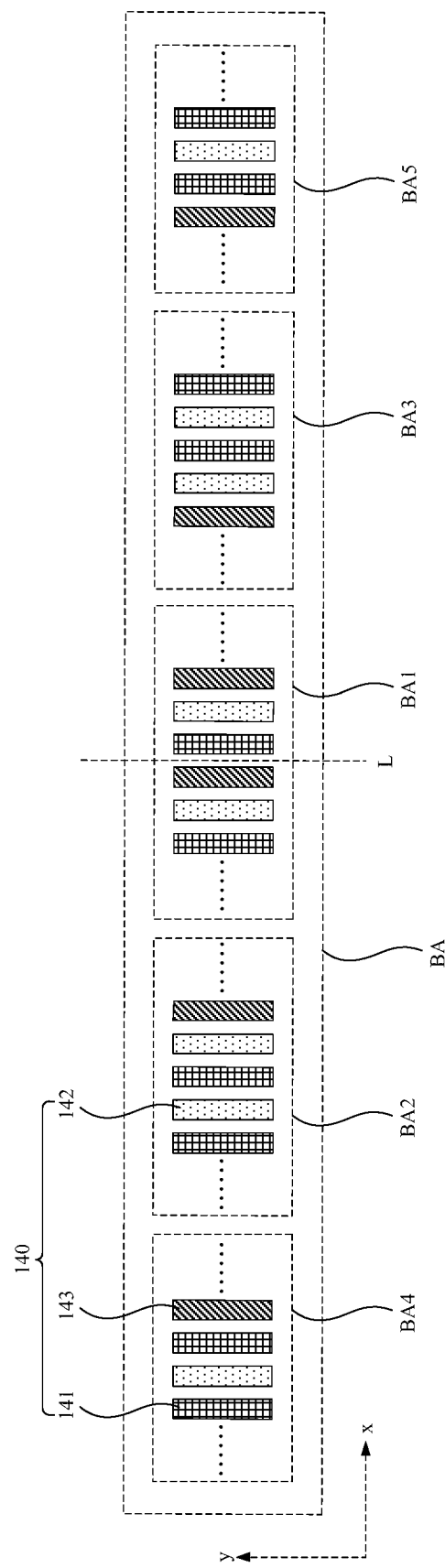
FIG. 10 is a schematic diagram of a pad distribution of a bonding area in FIG. 9.

FIG. 9 is a schematic plan diagram of another display panel according to an embodiment of the present disclosure, and FIG. 10 is a schematic diagram of a pad distribution of the bonding area in FIG. 9. Referring to FIG. 9 and FIG. 10, the display panel includes a display area AA and a non-display area NA surrounding the display area AA. A plurality of display units 110, a plurality of touch electrodes 120, and a plurality of fingerprint identification units 130 are arranged in the display area AA. The non-display area NA includes a bonding area BA, and the bonding area BA is where a flexible printed circuit or an integrated circuit is bound. The bonding area BA includes a first bonding area BA1, a second bonding area BA2, and a third bonding area BA3, and in the first direction x, the second bonding area BA2 and the third bonding area BA3 are located on two sides of the first bonding area BA1, respectively.

The bonding area BA is provided with a plurality of pads 140, and the plurality of pads 140 includes a plurality of first pads 141, a plurality of second pads 142, and a plurality of third pads 143. The number of the first pads 141 is greater than the number of the third pads 143, and the number of the second pads 142 is greater than the number of the third pads 143. The first bonding area BA1 is provided with at least one of the plurality of first pads 141, at least one of the plurality of second pads 142, and at least one of the plurality of third pads 143, and the at least one first pad 141, the at least one second pad 142, and the at least one third pad 143 in the first bonding area BA1 are arranged alternately. The second bonding area BA2 is provided with at least one of the plurality of first pads 141 and at least one of the plurality of second pads 142. The third bonding area BA3 is provided with at least one of the plurality of first pads 141 and at least one of the plurality of second pads 142. Each of the first pad 141, the second pad 142, and the third pad 143 is one of the display pad, the touch pad and the fingerprint identification pad and the first pad 141, the second pad 142, and the third pad 143 are different from each other. The display pad is configured to provide a display signal to the display unit 110, the touch pad is configured to provide a touch driving signal to the touch electrode 120 and/or receive a touch sensing signal of the touch electrode 120, and the fingerprint identification pad is configured to receive a fingerprint identification signal of the fingerprint identification unit 130.

Further, in this embodiment, in the first bonding area BA1, the number of the first pads 141, the number of the second pads 142, and the number of the third pads 143 are identical. In other bonding areas of the bonding area BA except the first bonding area BA1, the number of the first pads 141 is greater than the number of the third pads 143 and the number of the second pads 142 is greater than the number of the third pads 143.

In this embodiment, the number of the display units is greater than the number of the fingerprint identification units, and the number of the fingerprint identification units is greater than the number of the touch electrodes. In an embodiment, the first pads 141 are display pads, the second pads 142 are fingerprint identification pads, and the third pads 143 are touch pads. That is, the number of the first pads 141 is greater than the number of the second pads 142, and the number of the second pads 142 is greater than the number of the third pads 143.

In an embodiment, first pads 141, second pads 142, and third pads 143 in the first bonding area BA1 are arranged in a manner that one first pad 141, one second pad 142, and one third pad 143 are arranged alternately, including but not limited to, an alternating pattern or sequence of one first pad 141, then one second pad 142, and then one third pad 143, or one second pad 142, then one first pad 141, and then one third pad 143. Or, in other words, in the first bonding area BA1, one first pad 141, one second pad 142, and one third pad 143 being arranged alternately may be interpreted that a group containing one first pad 141, one second pad 142, and one third pad 143 is arranged repeatedly in the first bonding area BA1. The first pad 141, the second pad 142, and the third pad 143 in the group can be arranged in any order. In this way, the lengths of the wirings that are located between the bonding area BA and the display area AA and used for connecting the pads 140 are shortened.

With continued reference to FIG. 10, in an embodiment, the bonding area BA further includes a fourth bonding area BA4 and a fifth bonding area BA5. The fourth bonding area BA4 is provided with at least one first pad 141, and the fifth bonding area BA5 is provided with at least one first pad 141. In the first direction x, the fourth bonding area BA4 is located on a side of the second bonding area BA2 facing away from the first bonding area BA1, and the fifth bonding area BA5 is located on a side of the third bonding area BA3 facing away from the first bonding area BA1. The second bonding area BA2 is provided with at least one first pad 141 and at least one second pad 142; the third bonding area BA3 is provided with at least one first pad 141 and at least one second pad 142; the fourth bonding area BA4 is provided with at least one first pad 141; and the fifth bonding area BA5 is provided with at least one of the first pads 141. In this way, in the bonding area BA, the number of the first pads 141 is greater than the number of the third pads 143, and the number of the second pads 142 is greater than the number of the third pads 143.

In an embodiment, the second bonding area BA2 is further provided with at least one third pad 143, and the third bonding area BA3 is further provided with at least one third pad 143. The at least one first pad 141, the at least one second pad 142, and the at least one third pad 143 in the second bonding area BA2 are arranged alternately, and the at least one first pad 141, the at least one second pad 142, and the at least one third pad 143 in the third bonding area BA3 are arranged alternately. When the number of the third pads 143 is also relatively large, the second bonding area BA2 and the third bonding area BA3 may be further provided with the third pad 143, to make the arrangement of the pads 140 in the bonding area BA more reasonable.

In an embodiment, in the second bonding area BA2, the number of the first pads 141 is equal to the number of the second pads 142 and is greater than the number of the third pads 143. In the third bonding area BA3, the number of the first pads 141 is equal to the number of the second pads 142 o and is greater than the number of the third pads 143.

In an embodiment, the fourth bonding area BA4 is further provided with at least one second pad 142 and at least one third pad 143, and the fifth bonding area BA5 is further provided with at least one second pad 142 and at least one third pad 143. When the number of the second pads 142 and the number of the third pads 143 are relatively large, each of the fourth bonding area BA4 and the fifth bonding area BA5 may be further provided with the second pad 142 and the third pad 143, in order to make the arrangement of the pads 140 in the bonding area BA more reasonable. The at least one first pad 141, the at least one second pad 142, and the at least one third pad 143 in the fourth bonding area BA4 are arranged alternately, and the at least one first pad 141, the at least one second pad 142, and the at least one third pad 143 in the fifth bonding area BA5 are arranged alternately, in order to shorten the lengths of the wirings that are located between the bonding area BA and the display area AA and used for connecting the pads 140.

Furthermore, in the fourth bonding area BA4, the number of the second pads 142 and the number of the third pads 143 are identical but are smaller than the number of the first pads 141; and in the fifth bonding area BA5, the number of the second pads 142 and the number of the third pads 143 are identical but are smaller than the number of the first pads 141. In this way, in the bonding area BA, the number of the first pads 141 is greater than the number of the second pads 142, and the number of the second pads 142 is greater than the number of the third pads 143.

In an embodiment, the fourth bonding area BA4 and the fifth bonding area BA5 are axis-symmetrical with each other about the centerline L of the first bonding area BA1, and the extending direction of the centerline L of the first bonding area BA1 is perpendicular to the first direction x, that is, the centerline L extends along the second direction y in FIG. 10. In this embodiment, the fourth bonding area BA4 and the fifth bonding area BA5 being axis-symmetrical with each other about the centerline L of the first bonding area BA1 means that an arrangement order of different pads in the fourth bonding area BA4 and an arrangement order of different pads in the fifth bonding area BA5 are axis-symmetrical with each other about the centerline L of the first bonding area BA1. Taking FIG. 10 as an example, along the first direction x, if the different pads in the fourth bonding area BA4 are arranged in an order of the first pad 141, the third pad 143, the first pad 141, and the second pad 142, then the different pads in the fifth bonding area BA5 are arranged in an order of the second pad 142, the first pad 141, the third pad 143, and the first pad 141. By setting that the fourth bonding area BA4 and the fifth bonding area BA5 are axis-symmetrical with each other about the centerline L of the first bonding area BA1, it allows the wirings that are located between the fourth bonding area BA4 and the display area AA and used for connecting the pads to be better axis-asymmetrical with the wirings that are located between the fifth bonding area BA5 and the display area AA and used for connecting the pads, which is more conducive to the layout of the wirings, thereby further reducing the border of the display panel and increasing the screen ratio.

Figure 11:
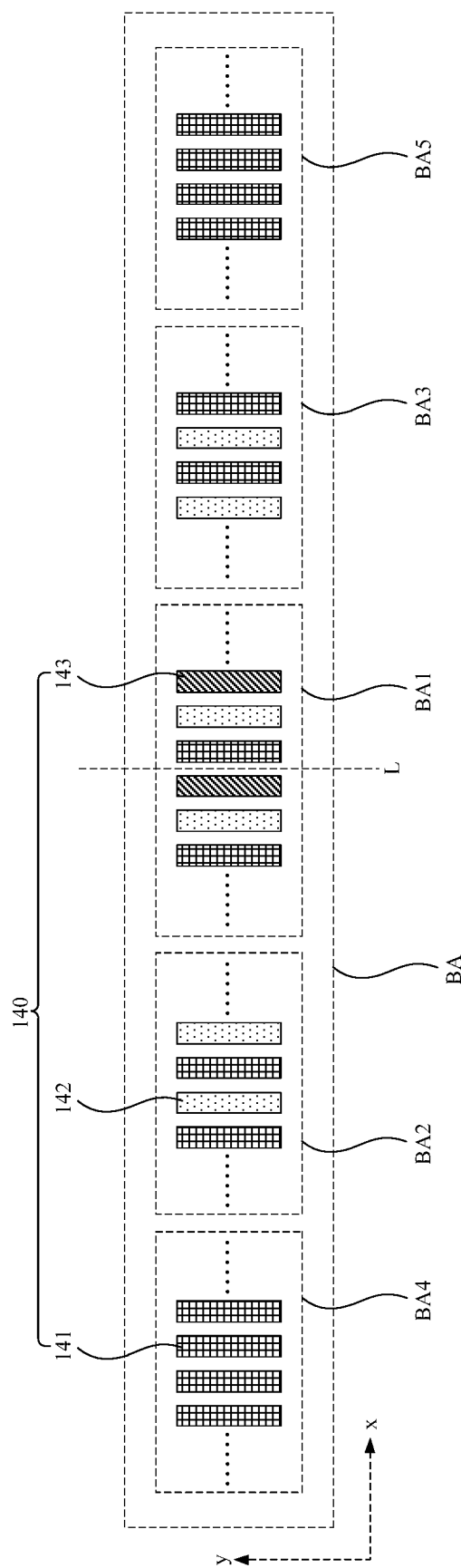
FIG. 11 is a schematic diagram of another pad distribution of the bonding area in FIG. 9.

FIG. 11 is schematic diagram of another pad distribution of the bonding area in FIG. 9. In an embodiment shown in FIG. 11, the same features as those of the bonding area shown in FIG. 10 are not described again. In this embodiment, the second bonding area BA2 is provided with only the first pad 141 and the second pad 142 without the third pad 143, and the third bonding area BA3 is provided with only the first pad 141 and the second pad 142 without the third pad 143.

Further, in this embodiment, the number of the first pads 141 in the second bonding area BA2 and the number of the second pads 142 in the second bonding area BA2 are identical; and the number of first pads 141 in the third bonding area BA3 and the number of the second pads 142 in the third bonding area BA3 are identical.

In this embodiment, the number of the display units is greater than the number of the fingerprint identification units, and the number of the fingerprint identification units is greater than the number of the touch electrodes. In an embodiment, the first pads 141 are display pads, the second pads 142 are fingerprint identification pads, and the third pads 143 are touch pads. That is, the number of the first pads 141 is greater than the number of the second pads 142, and the number of the second pads 142 is greater than the number of the third pads 143.

In an embodiment, first pads 141 and second pads 142 in the second bonding area BA2 and the third bonding area BA3 are arranged in a manner that one first pad 141 alternates with one second pad 142 in the second bonding area BA2, and one first pad 141 alternates with one second pad 142 in the third bonding area BA3, to reduce the lengths of the wirings that are located between the bonding area BA and the display area AA and used for connecting the pads 140.

With continued reference to FIG. 11, in an embodiment, the fourth bonding area BA4 is provided with only the first pad 141 without the second pad 142 and the third pad 143, and the fifth bonding area BA5 is provided with only the first pad 141 without the second pad 142 and the third pad 143. In this embodiment, when the number of the third pads 143 is relatively small, the third pad 143 may be provided only in the first bonding area BA1; and when the number of the first pads 141 is relatively large, each of the fourth bonding area BA4 and the fifth bonding area BA5 may be provided with only the first pad 141, to make the arrangement of the pads 140 in the bonding area BA more reasonable. In this embodiment, the fourth bonding area BA4 and the fifth bonding area BA5 are axis-symmetrical with each other about the centerline L of the first bonding area BA1.

It should be noted that in FIG. 10 and FIG. 11, the second bonding area BA2 and the third bonding area BA3 are also axis-symmetrical with each other about the centerline L of the first bonding area BA1, and details are not described herein again.

Figure 12:
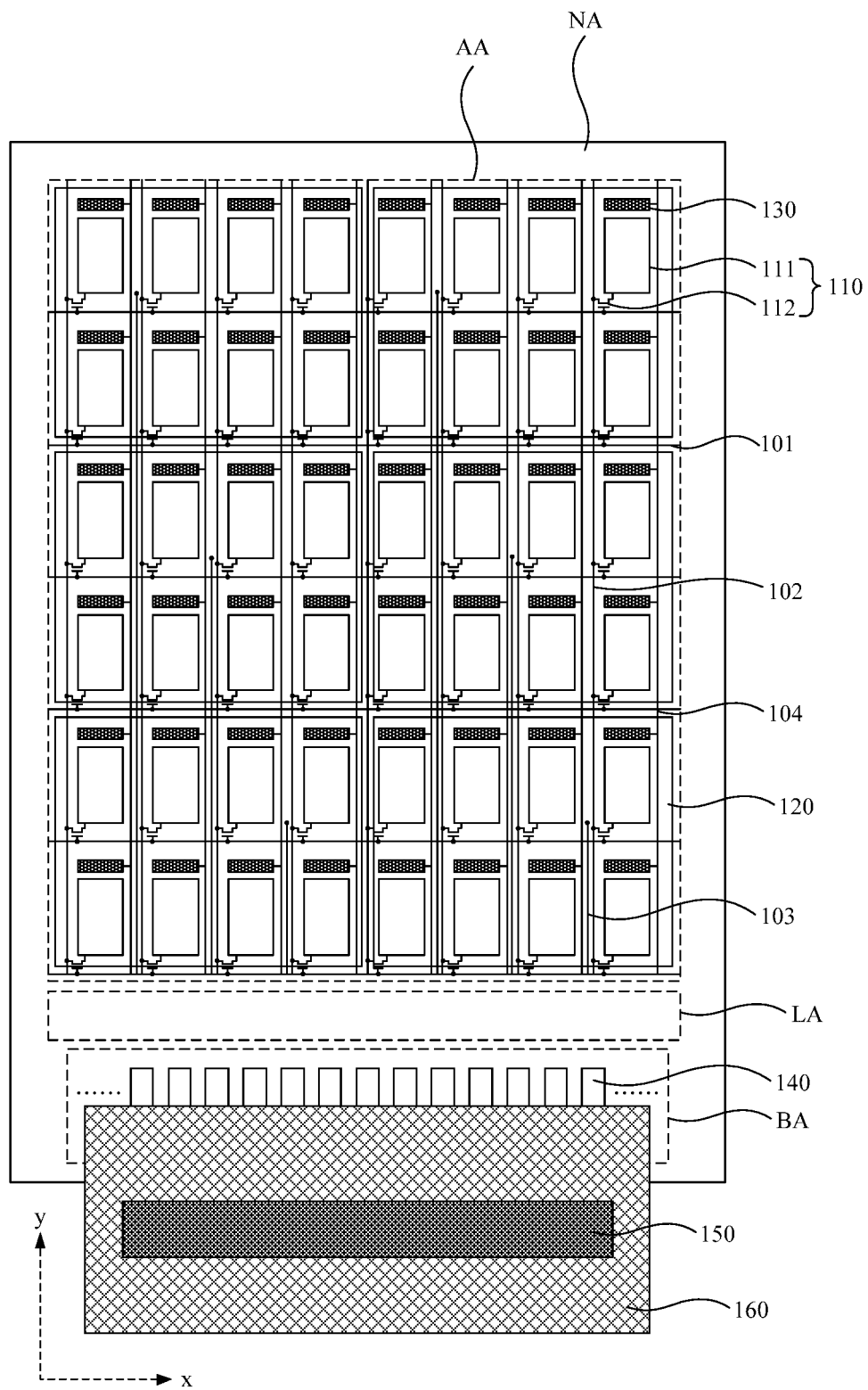
FIG. 12 is a schematic plan diagram of yet another display panel according to the present disclosure.
Figure 13:
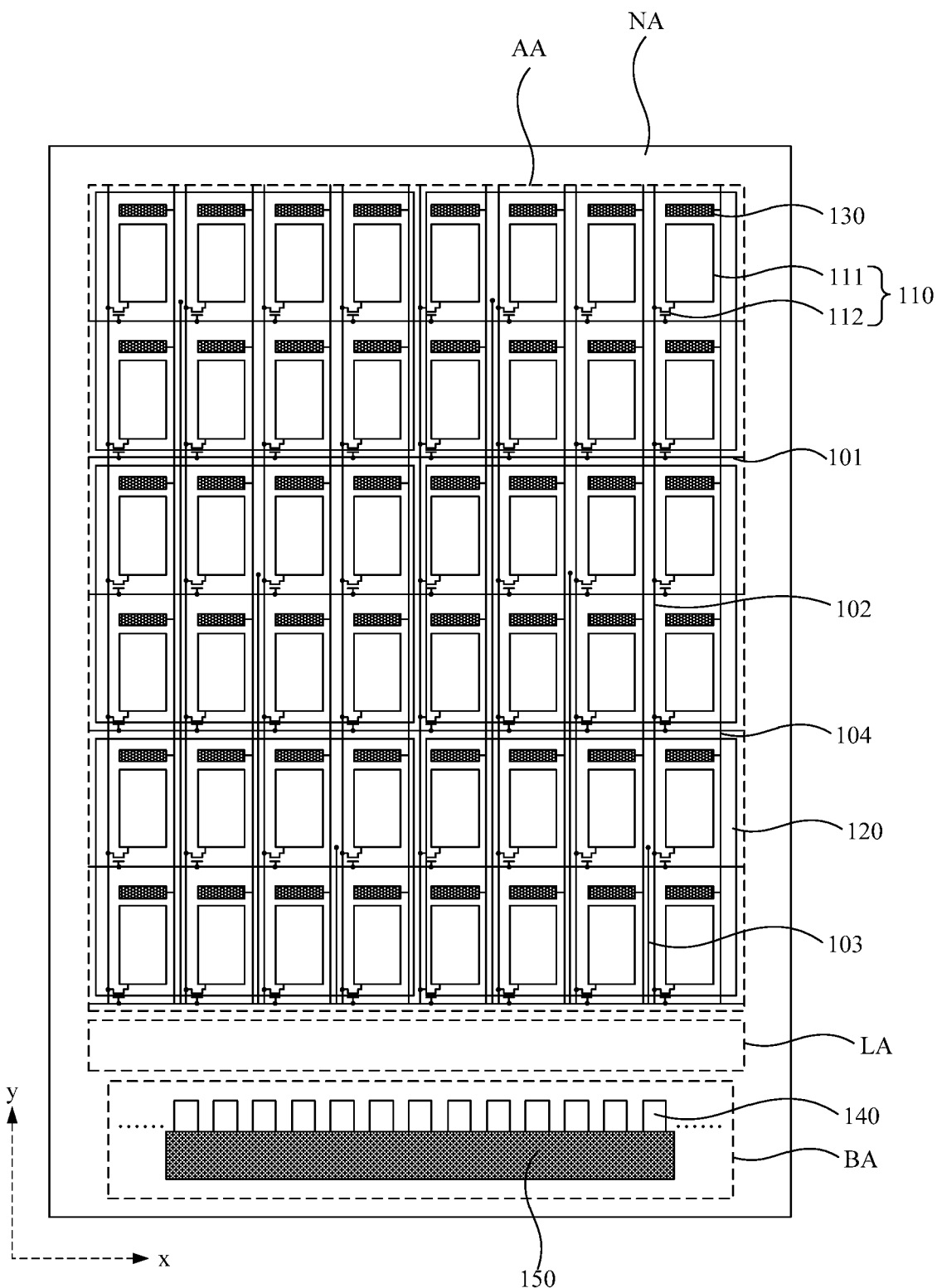
FIG. 13 is a schematic plan diagram of still another display panel according to the present disclosure.

Next, referring to FIG. 12 and FIG. 13, FIG. 12 is a schematic plan diagram of another display panel provided by the present disclosure, and FIG. 13 is a schematic plan diagram of still another display panel provided by the present disclosure. In FIG. 12, the bonding area BA is where an integrated circuit (IC) 150 is bound. The integrated circuit 150 provides a display signal to the display unit 110 through a display pad, provides a touch driving signal to the touch electrode 120 and/or receives a touch sensing signal of the touch electrode 120 through a touch pad, and receives a fingerprint identification signal of the fingerprint identification unit 130 through a fingerprint identification pad.

In FIG. 13, the bonding area BA is an area to which a flexible printed circuit (FPC) 160 is bound, and an integrated circuit 150 is bound to the flexible printed circuit 160. That is, using the COF (Chip on FPC) technology, the integrated circuit 150 is electrically connected to the pads of the bonding area BA through the flexible printed circuit 160, provides display signals to the display units 110 through the display pads, provides touch driving signals to the touch electrodes 120 and/or receives touch sensing signals of the touch electrodes 120 through the touch pads, and receives fingerprint identification signals of the fingerprint identification units 130 through the fingerprint identification pads. With the COF technology, it is unnecessary to provide an integrated circuit bonding area on the display panel, which can further reduce the border width of the display panel.

Figure 14:
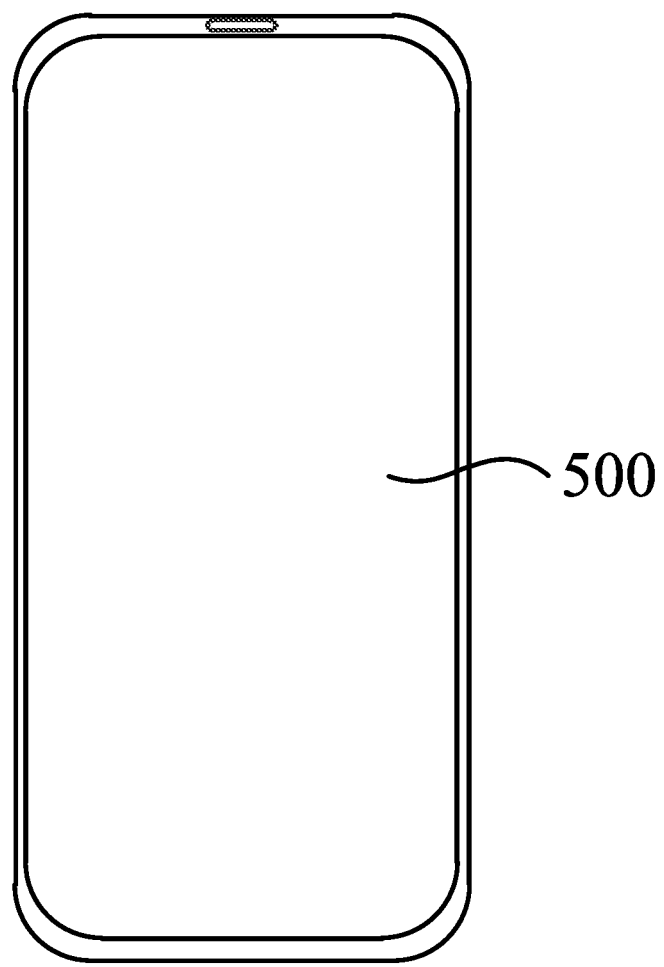
FIG. 14 is a structural schematic diagram of a display device according to an embodiment of the present disclosure.

Based on the same inventive concept, an embodiment of the present disclosure further provides a display device. FIG. 14 is a schematic structural diagram of a display device according to an embodiment of the present disclosure. Referring to FIG. 14, the display device includes the display panel 500 provided by any of the above embodiments of the present disclosure and may further include structures such as a backlight module, and these structures are not shown in FIG. 14 and are not described herein again. A light source for fingerprint identification can be provided on the backlight module, and the present disclosure is not limited thereto. In other alternative embodiments of the present disclosure, the display panel may be an organic light-emitting display panel, and details are not described herein again. In this embodiment, the display device is a mobile phone, and in other alternative embodiments of the present disclosure, the display device may be any device having display, touch, and fingerprint identification functions, such as a tablet computer or a laptop.

The above are only the preferred embodiments of the present disclosure and are not intended to limit the present disclosure. Any modifications, equivalents, improvements, etc. made within the principles of the present disclosure should be included in the protection scope of the present disclosure.

What is claimed is:

1. A display panel having a display area and a non-display area, wherein the non-display area comprises a bonding area to which a flexible printed circuit or an integrated circuit is bound, the bonding area comprises a first bonding area, a second bonding area, and a third bonding area, and the second bonding area and the third bonding area are located on two sides of the first bonding area in a first direction, respectively;

wherein the display panel comprises:
a plurality of display units arranged in the display area;
a plurality of touch electrodes arranged in the display area;
a plurality of fingerprint identification units arranged in the display area;
a plurality of first pads arranged in the bonding area;
a plurality of second pads arranged in the bonding area; and
a plurality of third pads arranged in the bonding area, wherein:
a number of the plurality of first pads is greater than a number of the plurality of third pads, and a number of the plurality of second pads is greater than the number of the plurality of third pads;
one or more first pads of the plurality of first pads, one or more second pads of the plurality of second pads, and one or more third pads of the plurality of third pads are alternately arranged in the first bonding area;
one or more first pads of the plurality of first pads and one or more second pads of the plurality of second pads are arranged in the second bonding area; and
one or more first pads of the plurality of first pads and one or more second pads of the plurality of second pads are arranged in the third bonding area;
wherein each of the plurality of first pads, the plurality of second pads, and the plurality of third pads is one of display pads, one of touch pads, or one of fingerprint identification pads; and each of the plurality of first pads, each of the plurality of second pads, and each of the plurality of third pads are different from each other,
wherein the display pads are configured to provide display signals to the plurality of display units, the touch pads are configured to at least one of provide touch driving signals to the plurality of touch electrodes or receive touch sensing signals of the plurality of touch electrodes, and the fingerprint identification pads are configured to receive fingerprint identification signals of the plurality of fingerprint identification units.

2. The display panel according to claim 1, wherein the one or more first pads and the one or more second pads in the second bonding area are arranged alternately, and the one or more first pads and the one or more second pads in the third bonding area are arranged alternately.

3. The display panel according to claim 1, wherein the second bonding area and the third bonding area are axis-symmetrical with each other about a centerline of the first bonding area, wherein an extending direction of the centerline of the first bonding area is perpendicular to the first direction.

4. The display panel according to claim 1, wherein a number of the one or more first pads in the first bonding area and the one or more second pads in the first bonding area are identical and are greater than a number of the one or more third pads in the first bonding area.

5. The display panel according to claim 4, wherein one or more third pads of the plurality of third pads are arranged in the second bonding area, and one or more third pads of the plurality of third pads are arranged alternately; and
the one or more first pads, the one or more second pads, and the one or more third pads in the second bonding area are arranged alternately, and the one or more first pads, the one or more second pads, and the one or more third pads in the third bonding area are arranged alternately.

6. The display panel according to claim 5, wherein;
in the second bonding area, a number of the one or more first pads, a number of the one or more second pads, and a number of the one or more third pads are identical, and one of the one or more first pads, one of the one or more second pads, and one of the one or more third pads are arranged alternately; and
in the third bonding area, a number of the one or more first pads, a number of the one or more second pads, and a number of the one or more third pads are identical, and one of the one or more first pads, one of the one or more second pads, and one of the one or more third pads are arranged alternately.

7. The display panel according to claim 1, wherein in the first bonding area, a number of the one or more first pads, a number of the one or more second pads, and a number of the one or more third pads are identical.

8. The display panel according to claim 7, wherein in the first bonding area, one of the one or more first pads, one of the one or more second pads, and one of the one or more third pads are arranged alternately.

9. The display panel according to claim 7, wherein the bonding area further comprises a fourth bonding area and a fifth bonding area; and in the first direction, the fourth bonding area is located on a side of the second bonding area facing away from the first bonding area, and the fifth bonding area is located at a side of the third bonding area facing away from the first bonding area; and
wherein one or more first pads of the plurality of first pads are arranged in the fourth bonding area, and one or more first pads of the plurality of first pads are arranged in the fifth bonding area.

10. The display panel according to claim 9, wherein the fourth bonding area and the fifth bonding area are axis-symmetrical with each other about a centerline of the first bonding area, and an extending direction of the centerline of the first bonding area is perpendicular to the first direction.

11. The display panel according to claim 9, wherein one or more third pads of the plurality of third pads is arranged in the second bonding area, and one or more third pads of the plurality of third pads are arranged in the third bonding area;
the one or more first pads, the one or more second pads, and the one or more third pads in the second bonding area are arranged alternately, and the one or more first pads, the one or more second pads, and the one or more third pads in the third bonding area are arranged alternately.

12. The display panel according to claim 11, wherein a number of the one or more first pads in the second bonding area and a number of the one or more second pads in the second bonding area are identical and are greater than a number of the one or more third pads in the second bonding area; and
a number of the one or more first pads in the third bonding area and a number of the one or more second pads in the third bonding area are identical and are greater than a number of the one or more third pads in the third bonding area.

13. The display panel according to claim 12, wherein one or more second pads of the plurality of second pads and one or more third pads of the plurality of third pads are arranged in the fourth bonding area, and one or more second pads of the plurality of second pads and one or more third pads of the plurality of third pads are arranged in the fifth bonding area;
the one or more first pads, the one or more second pads, and the one or more third pads in the fourth bonding area are arranged alternately, and the one or more first pads, the one or more second pads, and the one or more third pads in the fifth bonding area are arranged alternately.

14. The display panel according to claim 13, wherein in the fourth bonding area, a number of the one or more second pads and a number of the one or more third pads are identical and are smaller than a number of the one or more first pads; and in the fifth bonding area, a number of the one or more second pads and a number of the one or more third pads are identical and are smaller than a number of the one or more first pads.

15. The display panel according to claim 9, wherein none of the plurality of third pads is arranged in the second bonding area, and none of the plurality of third pads is arranged in the third bonding area.

16. The display panel according to claim 15, wherein a number of the one or more first pads in the second bonding area and a number of the one or more second pads in the second bonding area are identical, and a number of the one or more first pads in the third bonding area and a number of the one or more second pads in the third bonding area are identical.

17. The display panel according to claim 16, wherein one of the one or more first pads and one of the one or more second pads in the second bonding area are arranged alternately, and one of the one or more first pads and one of the one or more second pads in the third bonding area are arranged alternately.

18. The display panel according to claim 17, wherein none of the plurality of second pads and none of the plurality of third pads are arranged in the fourth bonding area, and none of the plurality of second pads and none of the plurality of third pads are arranged in the fifth bonding area.

19. A display device, comprising:
a display panel having a display area and a non-display area, wherein the non-display area comprises a bonding area to which a flexible printed circuit or an integrated circuit is bound, the bonding area comprises a first bonding area, a second bonding area, and a third bonding area, and the second bonding area and the third bonding area are located on two sides of the first bonding area in a first direction, respectively;
wherein the display panel comprises:
    a plurality of display units arranged in the display area;
    a plurality of touch electrodes arranged in the display area;
    a plurality of fingerprint identification units arranged in the display area;
    a plurality of first pads arranged in the bonding area;
    a plurality of second pads arranged in the bonding area; and
    a plurality of third pads arranged in the bonding area,
wherein a number of the plurality of first pads is greater than a number of the plurality of third pads, and a number of the plurality of second pads is greater than the number of the plurality of third pads;
one or more first pads of the plurality of first pads, one or more second pads of the plurality of second pads, and one or more third pads of the plurality of third pads are alternately arranged in the first bonding area;
one or more first pads of the plurality of first pads and one or more second pads of the plurality of second pads are arranged in the second bonding area; and
one or more first pads of the plurality of first pads and one or more second pads of the plurality of second pads are arranged in the third bonding area;
wherein each of the plurality of first pads, the plurality of second pads, and the plurality of third pads is one of display pads, one of touch pads, or one of fingerprint identification pads; and each of the plurality of first pads, each of the plurality of second pads, and each of the plurality of third pads are different from each other,
wherein the display pads are configured to provide display signals to the plurality of display units, the touch pads are configured to at least one of provide touch driving signals to the plurality of touch electrodes or receive touch sensing signals of the plurality of touch electrodes, and the fingerprint identification pads are configured to receive fingerprint identification signals of the plurality of fingerprint identification units.

* * * * *